(12) United States Patent
Madanipour et al.

(10) Patent No.: US 10,716,233 B2
(45) Date of Patent: Jul. 14, 2020

(54) SERVER

(71) Applicant: Hewlett Packard Enterprise Development LP, Houston, TX (US)

(72) Inventors: Zheila N. Madanipour, Houston, TX (US); Vincent W. Michna, Houston, TX (US); Patrick Raymond, Houston, TX (US); John Franz, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/066,869

(22) PCT Filed: Jan. 29, 2016

(86) PCT No.: PCT/US2016/015695
§ 371 (c)(1),
(2) Date: Jun. 28, 2018

(87) PCT Pub. No.: WO2017/131756
PCT Pub. Date: Aug. 3, 2017

(65) Prior Publication Data
US 2018/0376611 A1 Dec. 27, 2018

(51) Int. Cl.
| H05K 7/00 | (2006.01) |
| H05K 7/14 | (2006.01) |
| G06F 1/18 | (2006.01) |
| G06F 1/20 | (2006.01) |
| H05K 7/20 | (2006.01) |

(52) U.S. Cl.
CPC ........... H05K 7/1487 (2013.01); G06F 1/184 (2013.01); G06F 1/185 (2013.01); G06F 1/20 (2013.01); H05K 7/20709 (2013.01)

(58) Field of Classification Search
None
See application file for complete search history.

(56) References Cited

U.S. PATENT DOCUMENTS

| 5,214,570 A | 5/1993 | Shah |
| 5,801,924 A | 9/1998 | Salmonson |
| 6,023,412 A | 2/2000 | Morita |
| 7,301,776 B1 * | 11/2007 | Wang ..................... G06F 21/78 361/737 |

(Continued)

FOREIGN PATENT DOCUMENTS

| CN | 101971120 A | 2/2011 |
| CN | 102810001 A | 12/2012 |

(Continued)

OTHER PUBLICATIONS

PCT International Search and Written Opinion, dated Oct. 27, 2016, for Application No. PCT/US2016/015695, 12 pages.

(Continued)

*Primary Examiner* — Courtney L Smith
*Assistant Examiner* — Rashen E Morrison
(74) *Attorney, Agent, or Firm* — Mannava & Kang, P.C.

(57) ABSTRACT

According to an example, a server may include a housing including a bottom portion, a first node defined by first and second printed circuit assemblies, and a second node defined by third and fourth printed circuit assemblies.

16 Claims, 8 Drawing Sheets

(56) References Cited

U.S. PATENT DOCUMENTS

| | | | |
|---|---|---|---|
| 7,312,999 B1* | 12/2007 | Miyamura | G06F 1/181 |
| | | | 361/679.33 |
| 7,517,231 B2* | 4/2009 | Hiew | H05K 9/0067 |
| | | | 439/76.1 |
| 7,545,633 B2* | 6/2009 | Hsieh | G06F 1/185 |
| | | | 361/679.6 |
| 9,176,547 B2 | 11/2015 | Attlesey | |
| 2003/0184975 A1 | 10/2003 | Steinman | |
| 2005/0048805 A1 | 3/2005 | Budny | |
| 2006/0232948 A1* | 10/2006 | Haager | H05K 7/1417 |
| | | | 361/752 |
| 2008/0293265 A1 | 11/2008 | Nguyen | |
| 2011/0110038 A1 | 5/2011 | Musciano | |
| 2011/0149501 A1 | 6/2011 | Hughes et al. | |
| 2012/0307447 A1 | 12/2012 | Wu et al. | |
| 2018/0376611 A1 | 12/2018 | Madanipour et al. | |

FOREIGN PATENT DOCUMENTS

| | | |
|---|---|---|
| EP | 3409082 A1 | 12/2018 |
| WO | WO-2008127672 A2 | 10/2008 |
| WO | WO-2009114018 A1 | 9/2009 |
| WO | 2017/131756 A1 | 8/2017 |

OTHER PUBLICATIONS

Tony Wilson, "Build It: Big Capacity, Small Form," May 11, 2015, 11 pages, <http://www.maximumpc.com/hybrid-theory-big-capacity-small-form-2015/>.

* cited by examiner

SERVER

BACKGROUND

A server may include a computer program or a machine that responds to requests from other machines or machine readable instructions. A type of server includes a blade server which is a server computer with a modular design that minimizes the use of physical space and energy. Such a server may use an enclosure that holds multiple blade servers, where the enclosure provides services such as power, cooling, networking, various interconnects, and management. The blade server and the blade enclosure may constitute a blade system.

BRIEF DESCRIPTION OF DRAWINGS

Features of the present disclosure are illustrated by way of example and not limited in the following figure(s), in which like numerals indicate like elements, in which.

DETAILED DESCRIPTION

Figure 1:
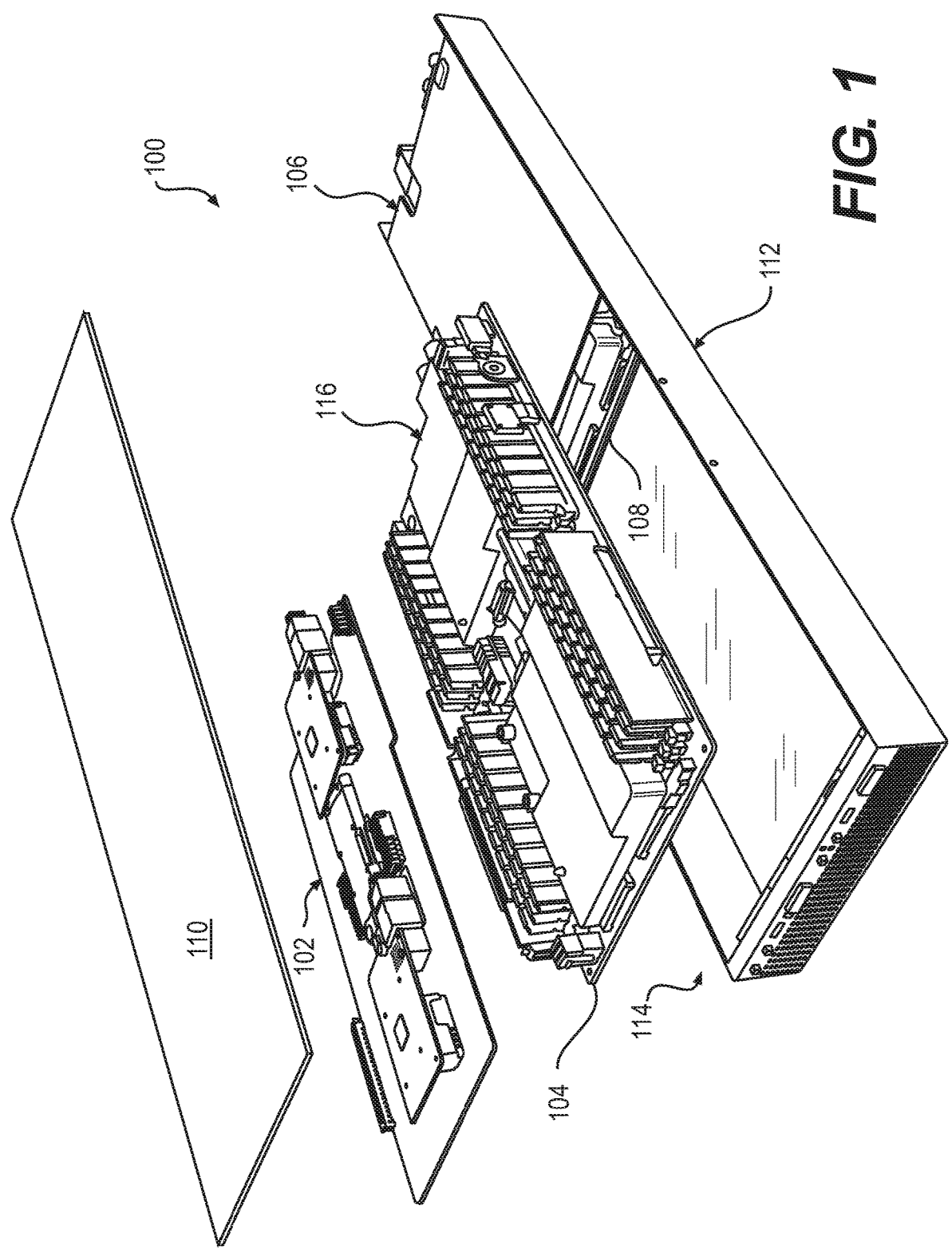
FIG. 1 illustrates an exploded view of a server, illustrating a first motherboard and a first input/output (I/O) board in a disassembled configuration, a second motherboard and a second I/O board in an assembled configuration, and top and bottom portions of a housing, according to an example of the present disclosure.

For simplicity and illustrative purposes, the present disclosure is described by referring mainly to examples. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Throughout the present disclosure, the terms "a" and "an" are intended to denote at least one of a particular element. As used herein, the term "includes" means includes but not limited to, the term "including" means including but not limited to. The term "based on" means based at least in part on.

With respect to rack and tray enclosures for servers, a rack of meter depth may include an enclosure that could accept trays of less than one meter (e.g., approximately 27 inches). A dual processor socket (i.e., 2P) motherboard for such a tray may include, for example, a length (e.g., approximately 22 inches) that allows for a single motherboard to fit per tray. If two motherboards are to be linearly deployed to increase the number of motherboards per tray, the depth of the tray, and the rack and tray enclosure would need to be increased, or otherwise, the enclosure may be limited to a single dual processor socket motherboard.

In order to address the aforementioned technical challenges with respect to increasing the density of motherboards included in such trays that include a 1U (i.e., (1U=1.75 inches)) thickness, as well as increasing the density of motherboards included in trays for servers that are used with rack and tray enclosures generally, according to examples, a server and a method for implementing a server are disclosed herein. For the server and the method for implementing the server disclosed herein, the server may use more of the volume (three-dimensional (3D)) space within the tray instead of extending linearly in the second dimension depth-wise in order to provide for two dual processor socket motherboards to fit a tray (e.g., an approximately 27 inch tray) designed for a single dual processor socket motherboard. In this regard, a single dual processor socket motherboard may be divided into two halves, with one half being the central processing unit (CPU)/memory complex, and the other half being the I/O section of the motherboard. Since a majority of the height of the electronics associated with the motherboard resides in a processor complex, dual in-line memory modules (DIMMs), and a heat sink, an I/O board associated with the motherboard may be inverted and mounted on top of the motherboard to provide for the heat sink to fill the gap between both boards as disclosed herein. Based on the vertical stackup of the motherboard and the I/O board as disclosed herein, the server may fit into a 1U enclosure. According to examples, the heat sink used with the I/O board and the motherboard may be a water cooled plate that contacts integrated circuits (ICs) on both of its sides as disclosed herein (i.e., CPUs/memory on one side, and I/O application-specific integrated circuits (ASICs) on the other).

For the server and the method for implementing the server disclosed herein, the DIMMs may transition vertically approximately 1U in height, where I/O board component keep out zones as disclosed herein may reside above the DIMM locations. Alternatively, for the server and the method for implementing the server disclosed herein, memory components may be disposed horizontally (e.g., in a stacked or un-stacked configuration). The I/O board may be customized for each customer with options including fabric type, administrative aspects, etc., embedded on the I/O board. Further, the I/O board may be developed with mezzanine adapters allowing flexibility in selection of the options for fabric type, administrative aspects, etc.

For the server and the method for implementing the server disclosed herein, two compute nodes may be provided in a 1U tray. A single liquid-cooled heat sink may be used for two dual processor socket motherboards. Alternatively, individual heat sinks may be used. Further, as disclosed herein, a single water pipe entry to the tray (i.e., housing) may be used for two dual processor socket motherboards.

According to examples, a server may include a housing (i.e., a tray) including a top side and a bottom portion. A first node may be defined by first and second printed circuit assemblies (i.e., an I/O board and a motherboard) respectively disposed adjacent to the top side and the bottom portion of the housing. A second node may be defined by third and fourth printed circuit assemblies (i.e., an I/O board and a motherboard) respectively disposed adjacent to the top side and the bottom portion of the housing. A first connector may attach the first and second printed circuit assemblies to one another, and a second connector may attach the third and fourth printed circuit assemblies to one another. According to examples, the housing may include a thickness of approximately 1.75 inches (i.e., 1U). According to examples, the housing may include a length of approximately 27 inches (or other lengths as needed). According to examples, the bottom portion of the housing may include a first side and a second side opposite the first side, and the first and second sides of the housing may be approximately perpendicular to the bottom portion of the housing. According to examples, the server may include memory components mounted on the second and fourth printed circuit assemblies (i.e., the two motherboards). According to examples, the memory components may be vertical memory components (e.g., DIMMs) disposed in a plurality of rows. According to examples, the server may include two sets of memory components disposed on each of the second and fourth printed circuit assemblies, and a processor disposed between each set of the memory components. According to examples, the server may include two sets of memory components disposed on each of the second and fourth printed circuit assemblies, and a heat sink (or multiple heat sinks) disposed between each set of the memory components, with each heat sink being disposed in respective contiguous engagement with circuits of the first and second printed circuit assemblies, and circuits of the third and fourth printed circuit assemblies. According to examples, the server may include mezzanine boards disposed on the first and third printed circuit assemblies opposite to processors disposed on the second and fourth printed circuit assemblies when the first and second nodes are positioned in the housing. According to examples, the second node may be substantially similar to the first node.

According to examples, the server may include a housing including a top side and a bottom portion, a first node defined by first and second printed circuit assemblies respectively disposed adjacent to the top side and the bottom portion of the housing, and a second node defined by third and fourth printed circuit assemblies respectively disposed adjacent to the top side and the bottom portion of the housing. Each of the first, second, third, and fourth printed circuit assemblies may include circuits that are disposed in a meshing configuration when the first and second nodes are positioned in the housing. According to examples, the server may further include memory components disposed on each of the second and fourth printed circuit assemblies, and a processor disposed adjacent to each of the memory components.

FIG. 1 illustrates an exploded view of a server 100, illustrating a first input/output (I/O) board 102 and a first motherboard 104 (e.g., a first node defined by first and second printed circuit assemblies as disclosed herein) in a disassembled configuration, a second I/O board 106 and a second motherboard 108 in an assembled configuration (a second node defined by third and fourth printed circuit assemblies as disclosed herein), and top portion 110 and bottom portion 112, respectively, of a housing 114, according to an example of the present disclosure. With respect to the top portion 110, instead of including the top portion 110, the back sides of the I/O boards may include an insulator protection sheet. In this case, the top of the housing 114 may be designated as the top side as disclosed herein. The housing 114 may be designated as a tray for the server 100. For the example of FIG. 1, the housing 114 may include a 1U (i.e., 1U=1.75 inches) thickness. Further, for the example of FIG. 1, the housing 114 may include an approximately 27 inch length.

Figure 2:
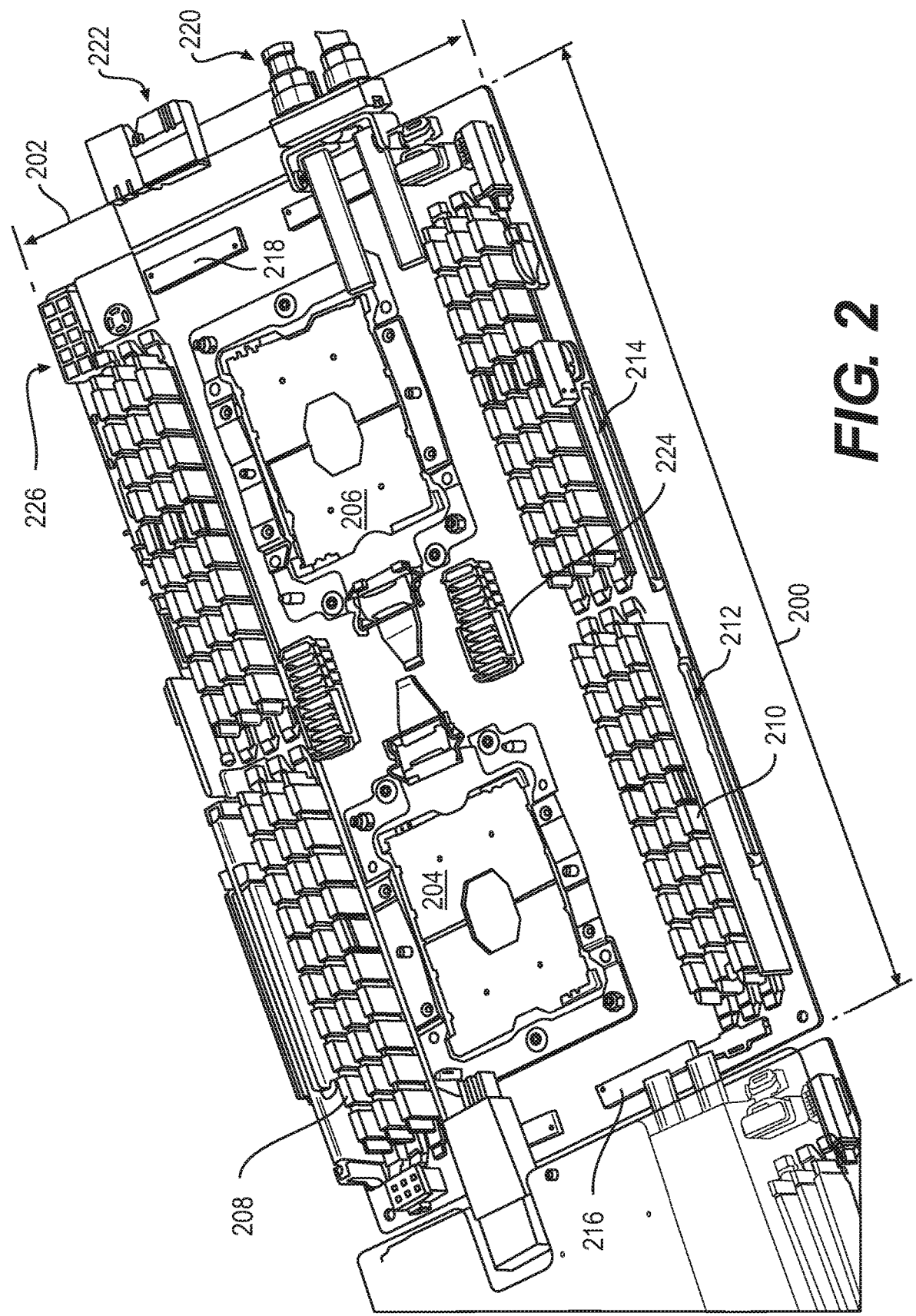
FIG. 2 illustrates a perspective view of a motherboard for the server of FIG. 1, according to an example of the present disclosure.

FIG. 2 illustrates a perspective view of a motherboard (e.g., both of the first and second motherboards 104 and 108), respectively, for the server 100, according to an example of the present disclosure.

Referring to FIGS. 1 and 2, the motherboards 104 and 108 may each include a length 200 that is designed to fit in a tray (e.g., an approximately 27 inch tray) designed for a single dual processor socket motherboard. For example, the motherboards 104 and 108 may each include a length 200 of approximately 13.5 inches (e.g., approximately 350 mm) to fit a tray including an approximately 27 inch in tray depth. The motherboards 104 and 108 may each include a width 202 of approximately 7.5 inches (e.g., approximately 190.5 mm). Each of the motherboards 104 and 108 may include two processors sockets 204 and 206 mounted in the middle of each board (lengthwise) from top view perspective as shown in the orientation of FIG. 2. With respect to DIMMs, each of the motherboards 104 and 108 may include, for example, six DIMMs 208 and 210 per processor, and use, for example, load-reduce DIMMs (LRDIMMs) to achieve large memory capacities. Thus, each of the motherboards 104 and 108 may include twelve DIMMs per motherboard, and twenty-four DIMMs per housing 114. For DIMMs and other components that do not need liquid cooling, such DIMMs and components may be located on outside edges of the motherboards 104 and 108, for example, in a lengthwise orientation as shown in FIG. 2. Each of the motherboards 104 and 108 may include two connectors 212 and 214 for the I/O boards, and the connectors 212 and 214 may be located on outer edges of the corresponding motherboard (i.e., between DIMMs and an edge of a motherboard) to connect to a corresponding I/O board, with one connector being disposed on each side.

Each of the motherboards 104 and 108 may further include voltage regulation (VR) circuits 216 and 218 that connect to the heat sink. Each of the motherboards 104 and 108 may include blind mate dripless connections 220, and interface board links 222 to the back plane. Each of the motherboards 104 and 108 may further include an electrical I/O connection link 224 to a corresponding I/O board.

Figure 3:
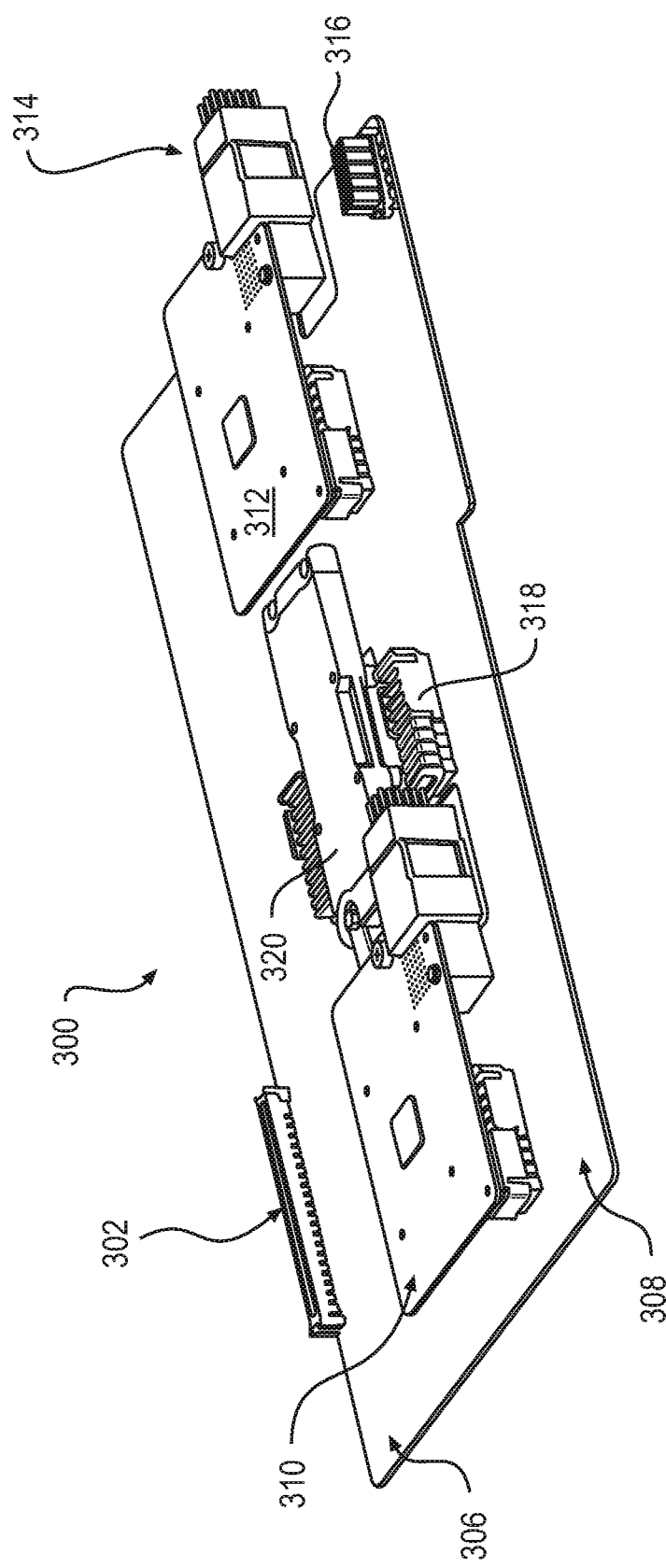
FIG. 3 illustrates a perspective view of an I/O board for the server of FIG. 1, according to an example of the present disclosure.

FIG. 3 illustrates a perspective view of an I/O board (e.g., both of the first and second I/O boards 102 and 106), respectively, for the server 100, according to an example of the present disclosure.

Referring to FIGS. 1-3, the first and second I/O boards 102 and 106 may include various devices 300 that need cooling located thereon and mounted above the corresponding motherboard (e.g., see FIG. 1). The cooling may be water-based cooling. The devices 300 that need cooling may be mounted in the middle (e.g., lengthwise) of the I/O board, inline with the processors sockets 204 and 206 in the orientation of FIG. 3. The topside of the I/O board may be designated as the side that includes the devices 300 illustrated in FIG. 3. Each of the I/O boards 102 and 106 may connect to corresponding motherboards 104 and 108 via two I/O riser board connectors (e.g., one riser board connector 302 shown in FIG. 3) that connect, for example, one x16 Peripheral Component Interconnect Express (PCIe) per processor for mezzanines, one x16 PCIe for Ethernet controller, and one x4 for DMI. The riser board connectors may be disposed on the topside of the I/O board.

For each of the first and second I/O boards 102 and 106, according to an example, no components may be provided on the reverse side (i.e., the underside of the I/O board in the orientation of FIG. 3), as the reverse side would be adjacent the top of the server and enclosed by the top portion 110. Further, for each of the first and second I/O boards 102 and 106, no components may be provided on sides 306 and 308 as these sides may contact the top of the DIMMs 208 and 210. Alternatively, for each of the first and second I/O boards 102 and 106, very low profile (VLP) memory may be used for gaining clearance for additional components on the I/O boards. Each of the first and second I/O boards 102 and 106 may include removable fabric mezzanine boards 310 and 312. With respect to the removable fabric mezzanine boards 310 and 312, the various components and functionality may be embedded on the I/O board instead of being individually removable. Each of the first and second I/O boards 102 and 106 may include a cabled connection 314 that directly links fabric mezzanines to the rear of the server, and into the backplane(s). Each of the first and second I/O boards 102 and 106 may include a power connection 316 for connection to a corresponding connector 226 on the motherboard. With respect to the electrical I/O connection link 224 on the motherboard, each of the first and second I/O boards 102 and 106 may include a matching electrical I/O connector 318. Each of the first and second I/O boards 102 and 106 may include a high voltage DC (HVDC) converter 320, which also connects to the heat sinks.

With respect to the housing 114, referring to FIGS. 1-3, the first and second motherboards 104 and 108, respectively, may be mounted, for example, to the bottom portion 112 of the housing 114. The corresponding I/O boards 102 and 106 may be mounted to the appropriate motherboards 104 and 108, where the motherboards and I/O boards face each other as shown in FIGS. 1 and 5-7. A liquid-cooled heat sink 116 may thermally connect to high heat components on both sets of boards (e.g., the two motherboards 104 and 108, and the two I/O boards 102 and 106). The liquid-cooled heat sink 116 may be positioned generally in the middle of the housing 114. For the example of FIGS. 1-3, the liquid-cooled heat sink 116 may include a customized profile so that the heat sink contacts all devices on both motherboards and I/O boards that need heat modulation. The remaining I/O components may be disposed towards the rear of the housing 114, for example, in the vicinity of the interface board links 222, and include, for example, storage controllers, management network interface cards (NICs), etc.

Figure 4:
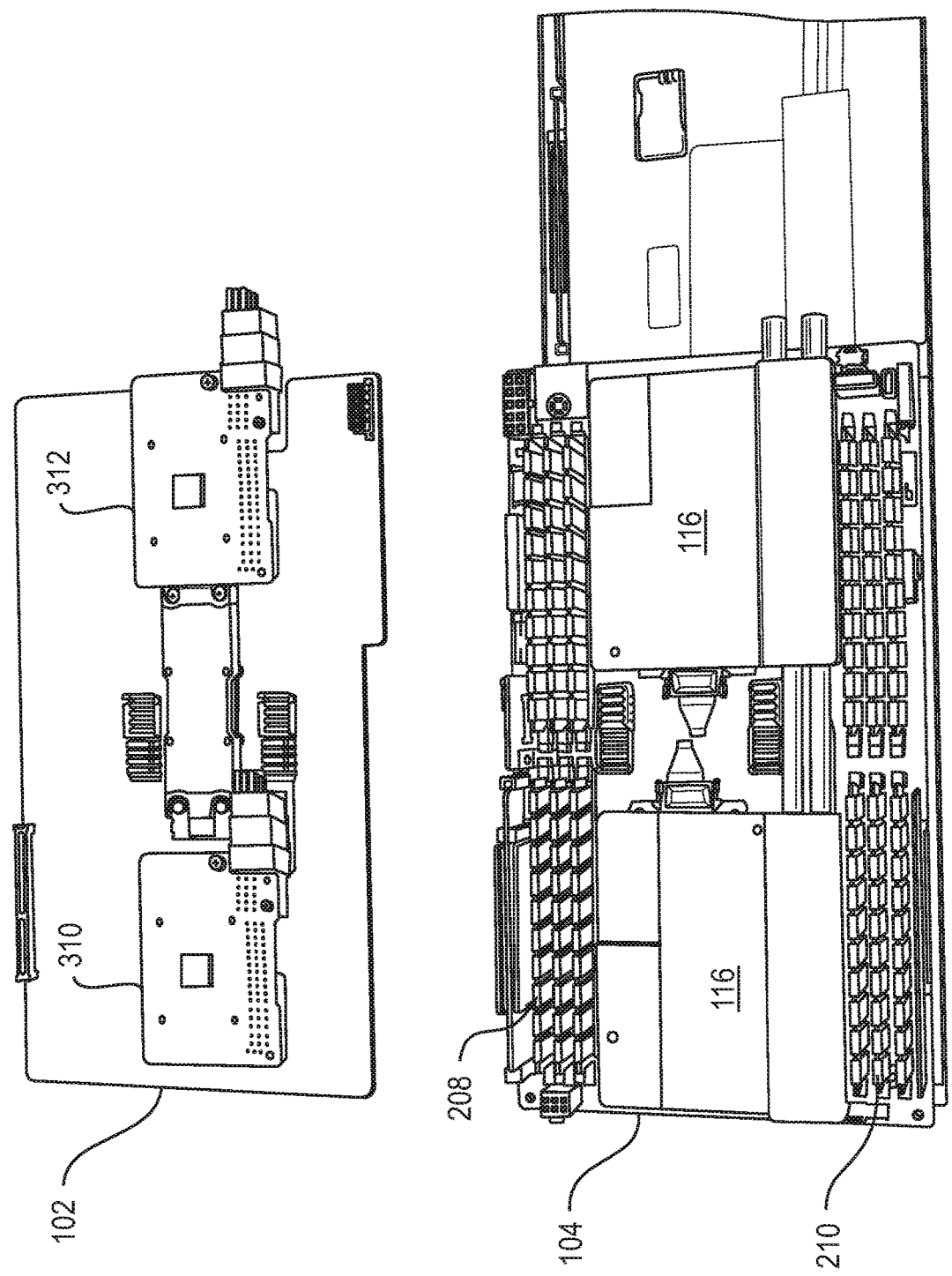
FIG. 4 illustrates a perspective view of the first motherboard and the first I/O board in a disassembled configuration for the server of FIG. 1, according to an example of the present disclosure.

FIG. 4 illustrates a perspective view of the first motherboard 104 and the first I/O board 102 in a disassembled configuration for the server 100, according to an example of the present disclosure.

Referring to FIGS. 1, 3, and 4, with respect to the I/O boards 102 and 106, the mezzanine boards 310 and 312 are illustrated in FIG. 4. Further, the liquid-cooled heat sinks 116 and the six DIMMs 208 and 210 are shown in FIG. 4.

Figure 5:
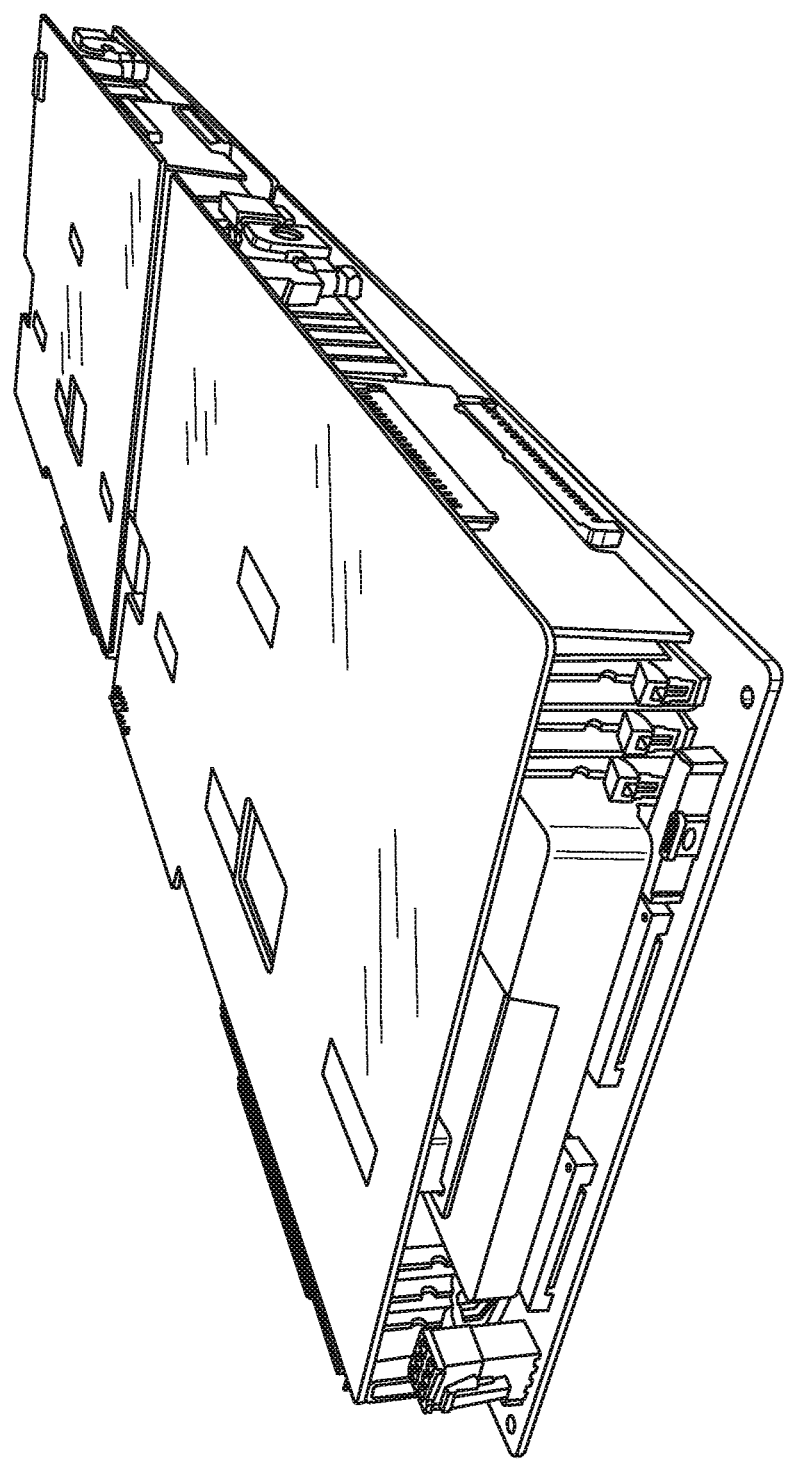
FIG. 5 illustrates a perspective view of a front portion of the server of FIG. 1, with the housing being removed, according to an example of the present disclosure.

FIG. 5 illustrates a perspective view of a front portion 500 of the server 100, with the housing 114 being removed, according to an example of the present disclosure.

Figure 6:
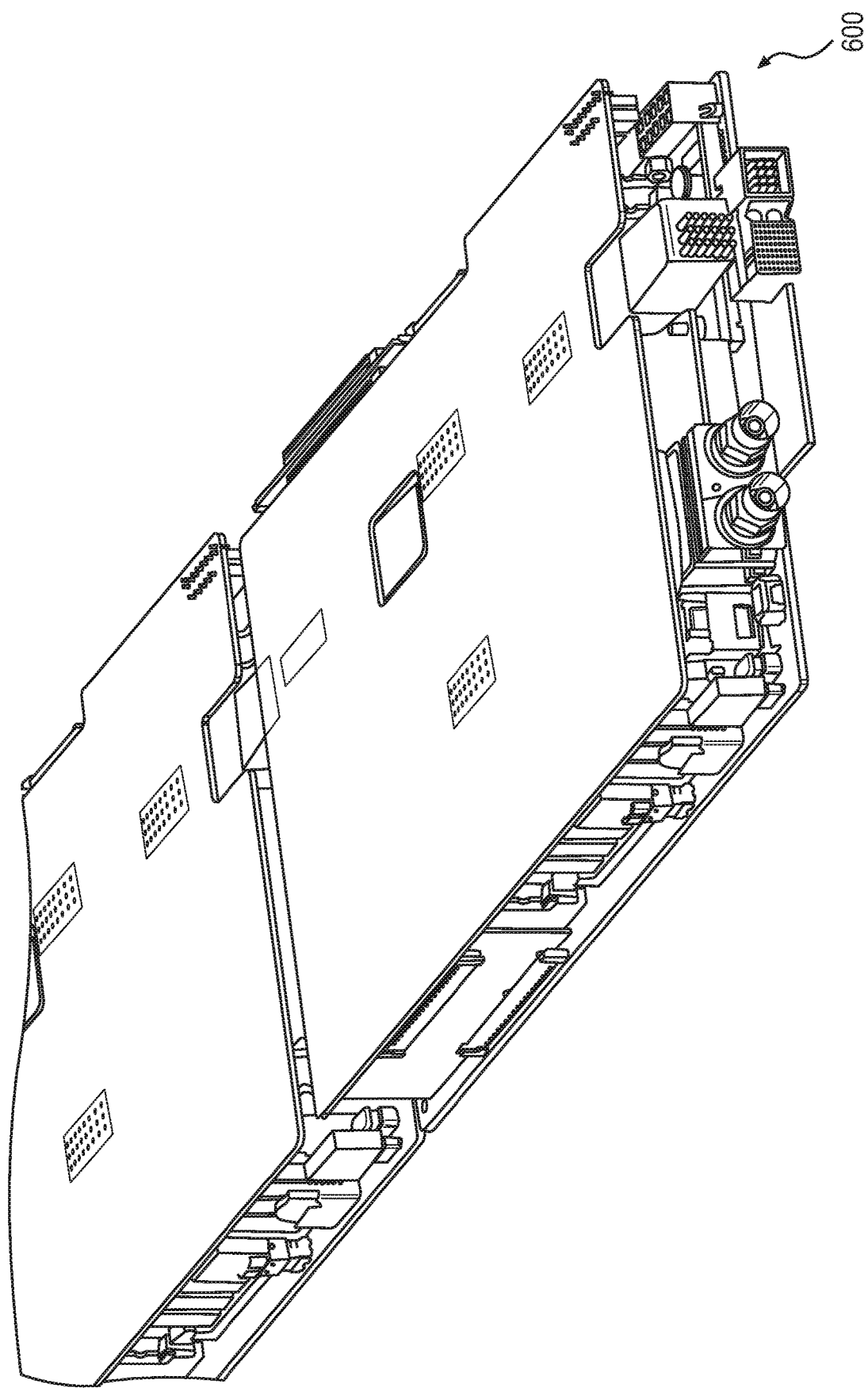
FIG. 6 illustrates a perspective view of a rear portion of the server of FIG. 1, with the housing being removed, according to an example of the present disclosure.

FIG. 6 illustrates a perspective view of a rear portion 600 of the server 100, with the housing 114 being removed, according to an example of the present disclosure.

Figure 7:
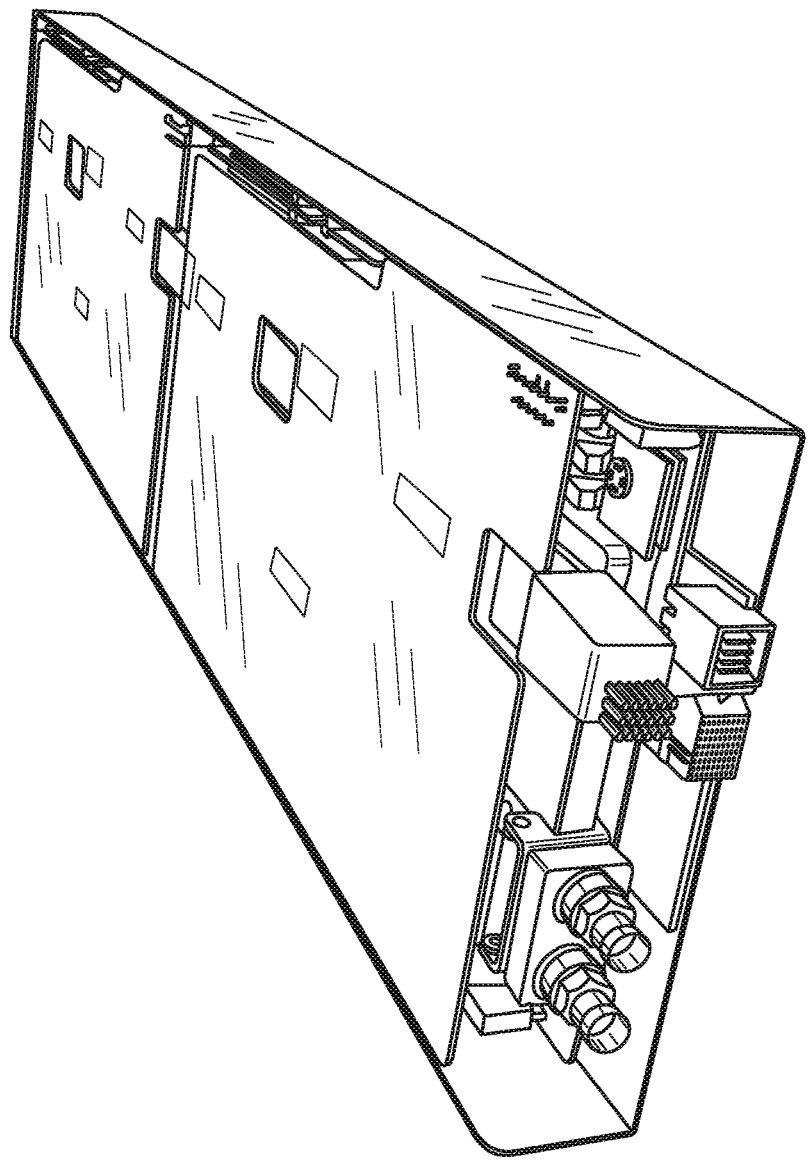
FIG. 7 illustrates a perspective view of the rear portion of the server of FIG. 1, including the bottom portion of the housing, according to an example of the present disclosure.

FIG. 7 illustrates a perspective view of the rear portion 600 of the server 100, including the bottom portion 112 of the housing 114, according to an example of the present disclosure.

Figure 8:
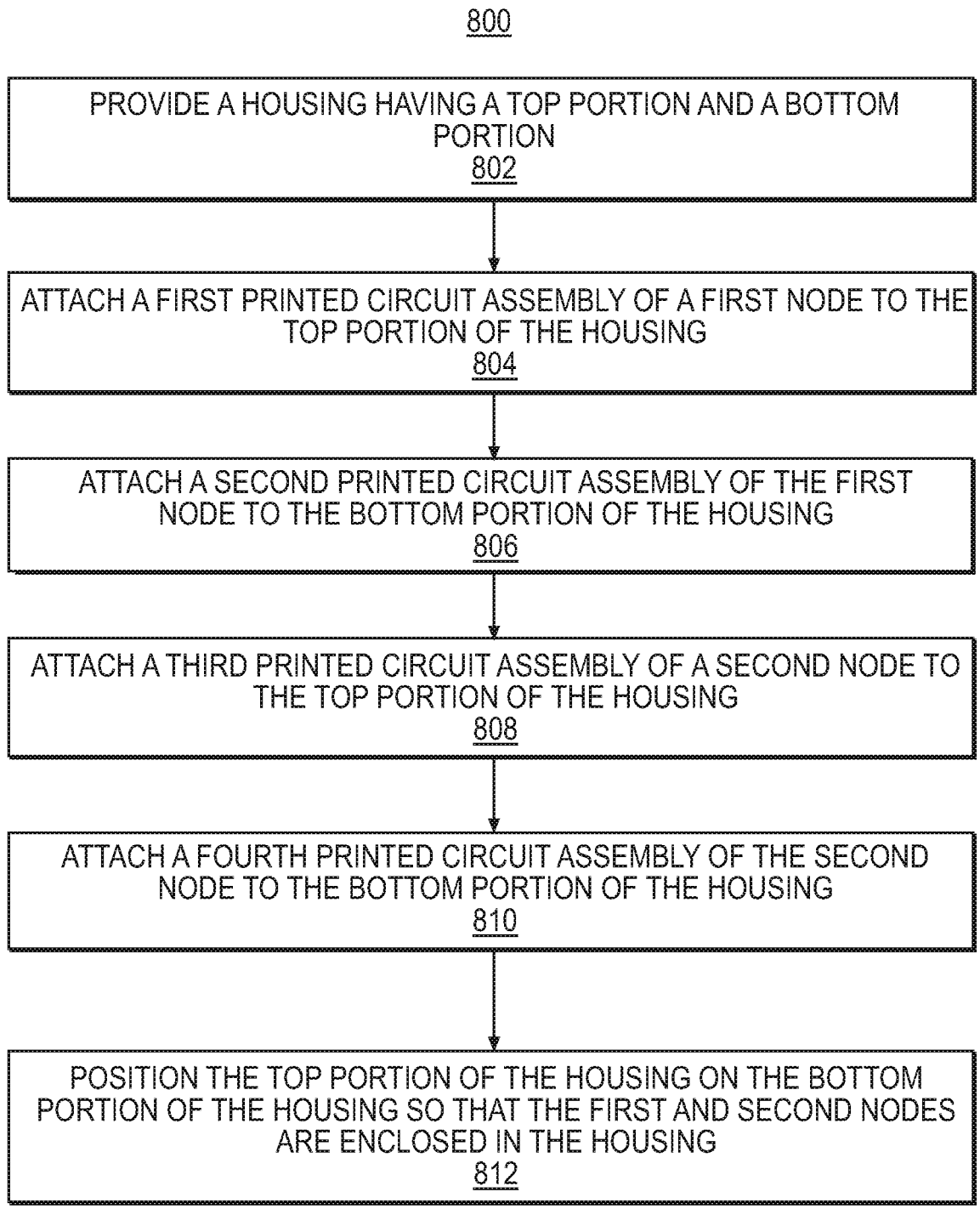
FIG. 8 illustrates a flowchart of a method for implementing a server, according to an example of the present disclosure.

FIG. 8 illustrates a flowchart of method 800 for implementing a server, corresponding to the example of the server 100 whose construction is described in detail above. The method 800 may be implemented on the server 100 with reference to FIGS. 1-7 by way of example and not limitation. The method 800 may be practiced in other apparatus.

Referring to FIGS. 1-8, for the method 800, at block 802, the method may include providing a housing having a top portion and a bottom portion. For example, referring to FIG. 1, the housing 114 may include top and bottom portions 110 and 112, respectively. As disclosed herein, with respect to the top portion 110, instead of including the top portion 110, the back sides of the I/O boards may include an insulator protection sheet. In this case, the top of the housing 114 may be designated as the top side as disclosed herein.

At block 804, the method may include attaching a first printed circuit assembly of a first node to the top portion of the housing. For example, referring to FIG. 1, the first I/O board 102 may be attached to the top portion 110 of the housing 114.

At block 806, the method may include attaching a second printed circuit assembly of the first node to the bottom portion of the housing. For example, referring to FIG. 1, the first motherboard 104 may be attached to the bottom portion 112 of the housing 114.

At block 808, the method may include attaching a third printed circuit assembly of a second node to the top portion of the housing. For example, referring to FIG. 1, the second I/O board 106 may be attached to the top portion 110 of the housing 114.

At block 810, the method may include attaching a fourth printed circuit assembly of the second node to the bottom portion of the housing. For example, referring to FIG. 1, the second motherboard 108 may be attached to the bottom portion 112 of the housing 114.

At block 812, the method may include positioning the top portion of the housing on the bottom portion of the housing so that the first and second nodes are enclosed in the housing. For example, referring to FIG. 1, the top portion 110 of the housing 114 may be positioned on the bottom portion of 112 the housing 114 so that the first and second nodes are enclosed in the housing 114 (e.g., see FIGS. 1 and 7).

According to examples, positioning the top portion of the housing on the bottom portion of the housing so that the first and second nodes are enclosed in the housing may further include positioning the top portion of the housing on the bottom portion of the housing so that the first and second nodes are enclosed in the housing, the first and second printed circuit assemblies are disposed opposite one another (e.g., see FIG. 7), and the third and fourth printed circuit assemblies are disposed opposite one another (e.g., see FIG. 7).

According to examples, the method may further include placing the housing in a rack.

What has been described and illustrated herein is an example along with some of its variations. The terms, descriptions and figures used herein are set forth by way of illustration only and are not meant as limitations. Many variations are possible within the spirit and scope of the subject matter, which is intended to be defined by the following claims—and their equivalents—in which all terms are meant in their broadest reasonable sense unless otherwise indicated.

What is claimed is:

1. A server comprising:
a housing including a top side and a bottom portion;

a first node defined by first and second printed circuit assemblies respectively disposed adjacent to the top side and the bottom portion of the housing;

a second node defined by third and fourth printed circuit assemblies respectively disposed adjacent to the top side and the bottom portion of the housing;

two sets of memory components disposed on each of the second and fourth printed circuit assemblies;

a processor disposed between each set of the memory components;

a first connector attaching the first and second printed circuit assemblies to one another; and a second connector attaching the third and fourth printed circuit assemblies to one another.

2. The server according to claim 1, wherein the housing includes a thickness of approximately 1.75 inches.

3. The server according to claim 1, wherein the housing includes a length of approximately 27 inches.

4. The server according to claim 1, wherein the bottom portion of the housing includes a first side and a second side opposite the first side, and the first and second sides of the housing are approximately perpendicular to the bottom portion of the housing.

5. The server according to claim 1, further comprising: memory components mounted on the second and fourth printed circuit assemblies.

6. The server according to claim 5, wherein the memory components are vertical memory components disposed in a plurality of rows.

7. The server according to claim 1, further comprising:

two sets of memory components disposed on each of the second and fourth printed circuit assemblies; and a heat sink disposed between each set of the memory components, each heat sink in respective contiguous engagement with circuits of the first and second printed circuit assemblies, and circuits of the third and fourth printed circuit assemblies.

8. The server according to claim 1, further comprising:

mezzanine boards disposed on the first and third printed circuit assemblies opposite to processors disposed on the second and fourth printed circuit assemblies when the first and second nodes are positioned in the housing.

9. The server according to claim 1, wherein the second node is substantially similar to the first node.

10. A server comprising:

a housing including a top side and a bottom portion;

a first node defined by first and second printed circuit assemblies respectively disposed adjacent to the top side and the bottom portion of the housing;

a second node defined by third and fourth printed circuit assemblies respectively disposed adjacent to the top side and the bottom portion of the housing;

a first connector attaching the first and second printed circuit assemblies to one another;

a second connector attaching the third and fourth printed circuit assemblies to one another;

two sets of memory components disposed on each of the second and fourth printed circuit assemblies; and a heat sink disposed between each set of the memory components, each heat sink in respective contiguous engagement with circuits of the first and second printed circuit assemblies, and circuits of the third and fourth printed circuit assemblies.

11. The server according to claim 10, further comprising:

memory components disposed on each of the second and fourth printed circuit assemblies; and a processor disposed adjacent each of the memory components.

12. A method of implementing a server, the method comprising:

providing a housing having a top portion and a bottom portion;

attaching a first printed circuit assembly of a first node to the top portion of the housing;

attaching a second printed circuit assembly of the first node to the bottom portion of the housing;

attaching a third printed circuit assembly of a second node to the top portion of the housing;

attaching a fourth printed circuit assembly of the second node to the bottom portion of the housing;

attaching the first and second printed circuit assemblies to one another by a first connector;

attaching the third and further printed circuit assemblies to one another by a second connector;

attaching mezzanine boards to the first and third printed circuit assemblies; and attaching processors to the second and fourth printed circuit assemblies opposite to the attached mezzanine boards.

13. The method of claim 12, further comprising positioning the top portion of the housing on the bottom portion of the housing so that the first and second nodes are enclosed in the housing.

14. The method of claim 12, further comprising:

placing the housing in a rack.

15. The server of claim 10, wherein each of the first, second, third, and fourth printed circuit assemblies include circuits that are disposed in a meshing configuration when the first and second nodes are positioned in the housing.

16. The method of claim 13, wherein positioning the top portion of the housing on the bottom portion of the housing so that the first and second nodes are enclosed in the housing further comprises:

positioning the top portion of the housing on the bottom portion of the housing so that the first and second nodes are enclosed in the housing, the first and second printed circuit assemblies are disposed opposite one another, and the third and fourth printed circuit assemblies are disposed opposite one another.

* * * * *